(12) United States Patent
Kikuchi et al.

(10) Patent No.: US 7,842,996 B2
(45) Date of Patent: Nov. 30, 2010

(54) MEMORY CELL OF NONVOLATILE SEMICONDUCTOR MEMORY

(75) Inventors: Shoko Kikuchi, Kawasaki (JP); Akira Takashima, Fuchu (JP); Naoki Yasuda, Yokohama (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 12/142,373

(22) Filed: Jun. 19, 2008

(65) Prior Publication Data

US 2008/0315288 A1 Dec. 25, 2008

(30) Foreign Application Priority Data

Jun. 22, 2007 (JP) ............................. 2007-165366

(51) Int. Cl.
*H01L 29/788* (2006.01)
*H01L 29/792* (2006.01)

(52) U.S. Cl. ................. 257/321; 257/324; 257/410; 257/E21.422; 257/E21.625; 257/E21.675

(58) Field of Classification Search ........... 438/201, 438/211, 261, 264, 593, FOR. 203; 257/324, 257/410, E21.422, E21.625
See application file for complete search history.

(56) References Cited

U.S. PATENT DOCUMENTS

| | | | |
|---|---|---|---|
| 6,770,923 B2 | 8/2004 | Nguyen et al. | |
| 2004/0164357 A1 | 8/2004 | Ahn et al. | |
| 2005/0242387 A1* | 11/2005 | Forbes | 257/314 |
| 2005/0275011 A1* | 12/2005 | Forbes | 257/316 |
| 2005/0277243 A1 | 12/2005 | Forbes | |
| 2006/0046522 A1* | 3/2006 | Ahn et al. | 438/785 |
| 2006/0284244 A1 | 12/2006 | Forbes et al. | |
| 2007/0132010 A1 | 6/2007 | Bhattacharyya | |
| 2008/0121979 A1* | 5/2008 | Nishikawa et al. | 257/321 |
| 2008/0271990 A1* | 11/2008 | Ino et al. | 204/192.15 |
| 2009/0004801 A1* | 1/2009 | Ahn et al. | 438/287 |
| 2009/0057750 A1* | 3/2009 | Takashima et al. | 257/321 |
| 2009/0096008 A1* | 4/2009 | Kim et al. | 257/316 |
| 2009/0179244 A1* | 7/2009 | Ono | 257/295 |

FOREIGN PATENT DOCUMENTS

| | | |
|---|---|---|
| JP | 2001-298099 | 10/2001 |
| JP | 2006-203200 | 8/2006 |

OTHER PUBLICATIONS

Dong Li, Ai, et. al., "Characteristics of LaAlO3 gate Dielectrics on Si grown by metalorganic chemical vapor deposition", Appl. Phys. Letters, vol. 83, No. 17, Oct. 27, 2003, pp. 3540-3542.*
U.S. Appl. No. 12/234,197, filed Sep. 19, 2008, Shingu, et al.

* cited by examiner

*Primary Examiner*—George Fourson
(74) *Attorney, Agent, or Firm*—Oblon, Spivak, McClelland, Maier & Neustadt, L.L.P.

(57) ABSTRACT

A memory cell of a nonvolatile semiconductor memory includes a semiconductor region, source/drain areas arranged separately from each other in the semiconductor region, a tunnel insulating film arranged on a channel region between the diffusion areas, a floating gate electrode arranged on the tunnel insulating film, an inter-electrode insulator arranged on the floating gate electrode, and a control gate electrode arranged on the inter-electrode insulator. The inter-electrode insulator includes lanthanoid-based metal Ln, aluminum Al, and oxygen O, and a composition ratio Ln/(Al+Ln) between the lanthanoid-based metal and the aluminum takes a value within the range of 0.33 to 0.39.

20 Claims, 12 Drawing Sheets

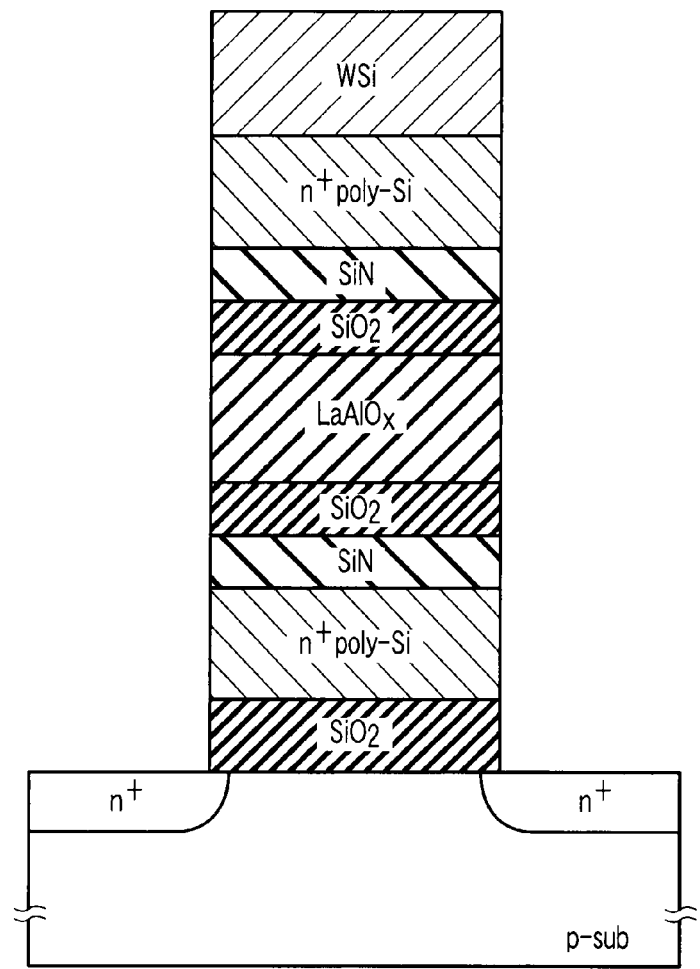
F I G. 5
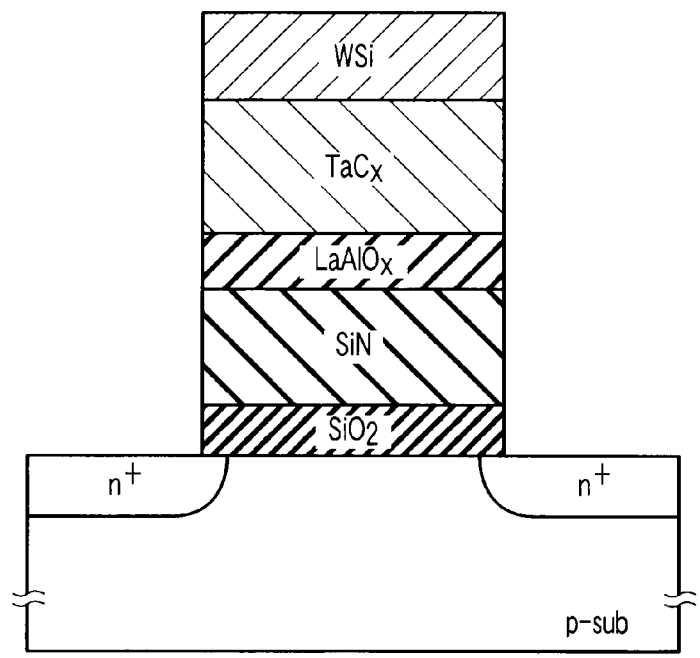
F I G. 6

MEMORY CELL OF NONVOLATILE SEMICONDUCTOR MEMORY

CROSS-REFERENCE TO RELATED APPLICATIONS

This application is based upon and claims the benefit of priority from prior Japanese Patent Application No. 2007-165366, filed Jun. 22, 2007, the entire contents of which are incorporated herein by reference.

BACKGROUND OF THE INVENTION

1. Field of the Invention

The present invention relates to a nonvolatile semiconductor memory.

2. Description of the Related Art

The size of a memory cell of a nonvolatile semiconductor memory, for instance, a flash memory, is undergoing microfabrication in accordance with an increase of a memory capacity, while it becomes necessary for the memory cell not to lower a coupling ratio.

As for a technique to increase the coupling ratio of the memory cell, in an aspect of the device structure, for instance, there is a structure (hereinafter referred to as three-dimensional cell structure) in which a sidewall of a channel length direction (a direction orthogonally crossing the extending direction of a word line as a control gate electrode) of a floating gate electrode is covered by the control gate electrode.

However, in the three-dimensional cell structure, problems of interference between adjacent two cells, property of embedding an insulation film in a narrow space between adjacent two cells, and the like become conspicuous due to the microfabrication of the memory cell. Thus, when considering such problems, a structure (hereinafter, referred to as two-dimensional cell structure) in which a side surface in a channel length direction of the floating gate electrode is not covered by a control gate electrode, is more favorable than the three-dimensional cell structure.

In the two-dimensional cell structure, in order to increase the coupling ratio, in the aspect of materials, for instance, high dielectric constant materials, called high-k materials, having higher dielectric constant than $SiO_2/SiN/SiO_2$ (hereinafter referred to as an ONO film) is used as an inter-electrode insulator between the floating gate electrode and the control gate electrode (for instance, refer to JP-A 2006-203200 (KOKAI)).

Here, in the two-dimensional structure, it should be noted that a high electric field is applied to an inter-electrode insulator. In other words, the inter-electrode insulator necessitates characteristics in which the inter-electrode insulator has high dielectric constant, and has less leakage current at a high electric field region.

This can also be applied to a memory cell, for instance, a memory cell with a MONOS structure, comprised of an insulating film whose charge trap layer has a charge trap function. That is, a blocking insulator between the charge trap layer and the control gate electrode necessitates characteristics in which the blocking insulator has high dielectric constant, and has less leakage current at a high electric field region.

However, in the progress of microfabrication of the memory cell, until now, sufficient examination has not been performed with respect to materials having such characteristics.

BRIEF SUMMARY OF THE INVENTION

A memory cell according to an aspect of the present invention comprises a semiconductor region, source/drain areas arranged separately from each other in the semiconductor region, a tunnel insulating film arranged on a channel region between the diffusion areas, a floating gate electrode arranged on the tunnel insulating film, an inter-electrode insulator arranged on the floating gate electrode, and a control gate electrode arranged on the inter-electrode insulator. The inter-electrode insulator includes lanthanoid-based metal Ln, aluminum Al, and oxygen O, and a composition ratio Ln/(Al+Ln) between the lanthanoid-based metal and the aluminum takes a value within the range of 0.33 to 0.39.

A memory cell according to an aspect of the present invention comprises a semiconductor region, source/drain areas arranged separately from each other in the semiconductor region, a tunnel insulating film arranged on a channel region between the diffusion areas, a charge trap layer arranged on the tunnel insulating film, a blocking insulator arranged on the charge trap layer, and a control gate electrode arranged on the blocking insulator. The blocking insulator includes lanthanoid-based metal Ln, aluminum Al, and oxygen O, and a composition ratio Ln/(Al+Ln) between the lanthanoid-based metal and the aluminum takes a value within the range of 0.33 to 0.39.

BRIEF DESCRIPTION OF THE SEVERAL VIEWS OF THE DRAWING

FIG. 5 is a cross-sectional view showing a memory cell of a nonvolatile semiconductor memory of a second embodiment;

FIG. 6 is a cross-sectional view showing a memory cell of a nonvolatile semiconductor memory of a third embodiment;

DETAILED DESCRIPTION OF THE INVENTION

A memory cell of a nonvolatile semiconductor memory of an aspect of the present invention will be described below in detail with reference to the accompanying drawings.

1. Outline

A principal part of the present invention lies in a composition ratio of a lanthanoid-based metal and aluminum where a leakage current in a high electric field region becomes a reference value or less required by a device specification, when high dielectric constant materials including a lanthanoid-based metal Ln, aluminum Al, and oxide O are used as an inter-electrode insulator or a blocking insulator.

Specifically, a composition ratio Ln/(Al+Ln) of a lanthanoid-based metal and aluminum is a value within the range of 0.33 to 0.39. The range of the composition ratio is satisfied all over the inter-electrode insulator or the blocking insulator. It is preferable that the composition ratio is, for instance, a constant.

Thereby, improving the coupling ratio based on enabling high dielectric constant of the inter-electrode insulator or the blocking insulator, and improving the leakage current characteristics at a high electric field region of the inter-electrode insulator or the blocking insulator are achieved at the same time, so that a nonvolatile semiconductor memory with high reliability is realized.

The inter-electrode insulator and the blocking insulator are defined below:

The inter-electrode insulator is an insulator which blocks an electron flow between a floating gate electrode as a charge trap layer and a control gate electrode. The blocking insulator is an insulator which blocks an electron flow between a insulating layer as a charge trap layer and a control gate electrode.

2. Device Structure

Figure 1:
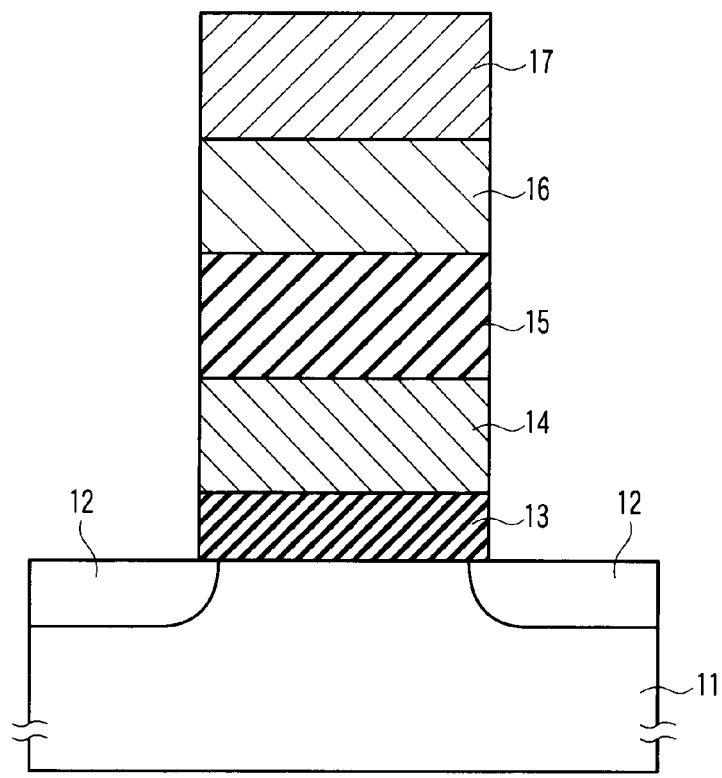
FIG. 1 is a cross-sectional view showing a memory cell of a nonvolatile semiconductor memory according to an embodiment.

FIG. 1 shows a memory cell of a nonvolatile semiconductor memory.

In a semiconductor substrate (semiconductor region) 11 of a first conductive type, source/drain diffusion areas 12 of a second conductive type are arranged separately from each other. The semiconductor substrate 11 is, for instance, a silicon substrate. The source/drain diffusion areas 12 can be formed in a well region in the semiconductor substrate 11.

A charge trap layer 14 is arranged via a tunnel insulating film (for instance, silicon oxide) 13 on a channel region between the source/drain diffusion areas 12. In addition, control gate electrodes 16, 17 are arranged via an insulating film 15 on the charge trap layer 14.

Here, the charge trap layer 14 can use one of conductor and insulator.

The charge trap layer is a floating gate electrode, when the charge trap layer 14 is a conductor (for instance, conductive polysilicon). In this situation, the insulating film 15 between the floating gate electrode 14 and the control gate electrodes 16, 17 results in an inter-electrode insulator. In addition, when the charge trap layer 14 is an insulator (for instance, silicon nitride), the insulating film 15 between the charge trap layer 14 and the control gate electrodes 16, 17 results in a blocking insulator.

A lower layer of the control gate electrodes 16, 17 is comprised of, for instance, a conductive polysilicon, while an upper layer thereof is comprised of metal silicide.

As described in the outline, the principal part of the present invention lies in the insulating film (inter-electrode insulator or blocking insulator) 15.

The insulating film 15 is comprised of materials in which the leakage current results in a reference value or less when a write electric field required by device specification is applied thereto.

Here, the write electric field required by the device specification is a value within 20-30 MV/cm for the inter-electrode insulator, and a value within 15-25 MV/cm for the blocking insulator.

In the present invention, as such materials, a lanthanoid-based metal Ln, aluminum Al and high dielectric constant materials including oxygen O are used. In addition, the composition ratio Ln/(Al+Ln) of the lanthanoid-based metal and the aluminum is made into a value within the range of 0.33 to 0.39.

The reason for this will be described.

Figure 2:
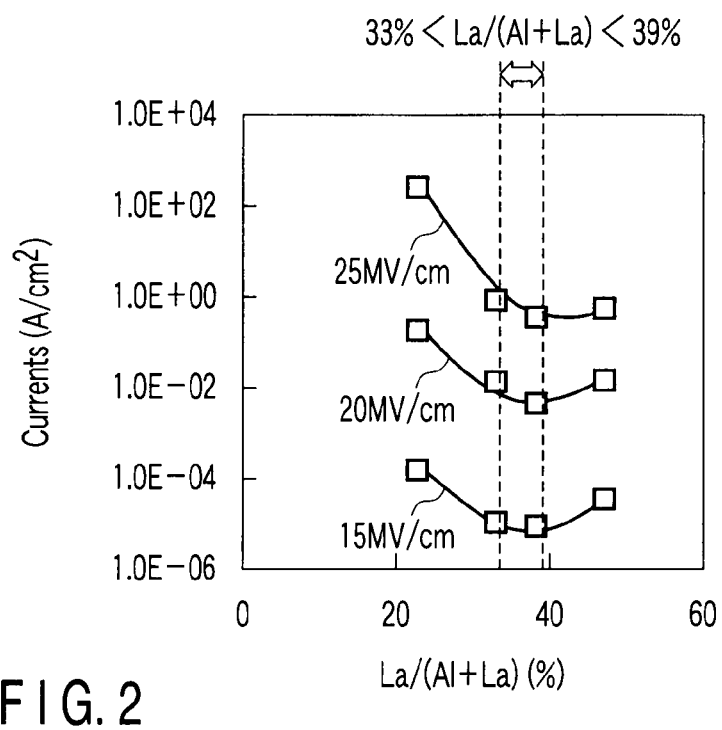
FIG. 2 is a view showing results of a first element experiment.

FIG. 2 shows results of a first element experiment relating to a leakage current.

As the inter-electrode insulator or the blocking insulator, lanthanum aluminate ($LaAlO_x$) which is one of a lanthanoid-based metal oxide aluminate ($LnAlO_x$) is used. The thickness thereof is made approximately 16 nm. In addition, as the semiconductor substrate, the silicon substrate is used.

Here, "x" of $LnAlO_x$ and $LaAlO_x$ means that a composition of an actual film may be not in a theoretical value due to oxygen deficiency. The theoretical value of x is 3 for $LaAlO_x$.

FIG. 2 shows variation of the leakage current ($A/cm^2$), when varying the composition ratio La/(Al+La) of lanthanum (La) and aluminum (Al) from 0.23 to 0.48. The composition ratio is derived by ICP emission spectral analysis as an average in the entire film.

The electric field (15 MV/cm, 20 MV/cm, 25 MV/cm) applied to the inter-electrode insulator or the blocking insulator is a parameter.

As is clear from FIG. 2, when the composition ratio La/(Al+La) becomes less than 0.33, the leakage current in the high electric field region increases largely. In addition, also when the composition ratio La/(Al+La) exceeds 0.39, the leakage current in the high electric field region increases largely.

As a result, an optimal range of the composition ratio La/(Al+La) of $LaAlO_x$ ranges from 0.33 to 0.39.

A reason why the leakage current increases at the time the composition ratio La/(Al+La) is less than 0.33, is to be considered that $LaAlO_x$ approaches nature of $Al_2O_3$ of low dielectric constant when contents of the aluminum (Al) become large. In addition, a reason why the leakage current increases at the time the composition ratio La/(Al+La) exceeds 0.39, is to be considered that moisture absorbing property peculiar to rare earth elements is generated when additive quantity of lanthanum (La) increases.

Figure 3:
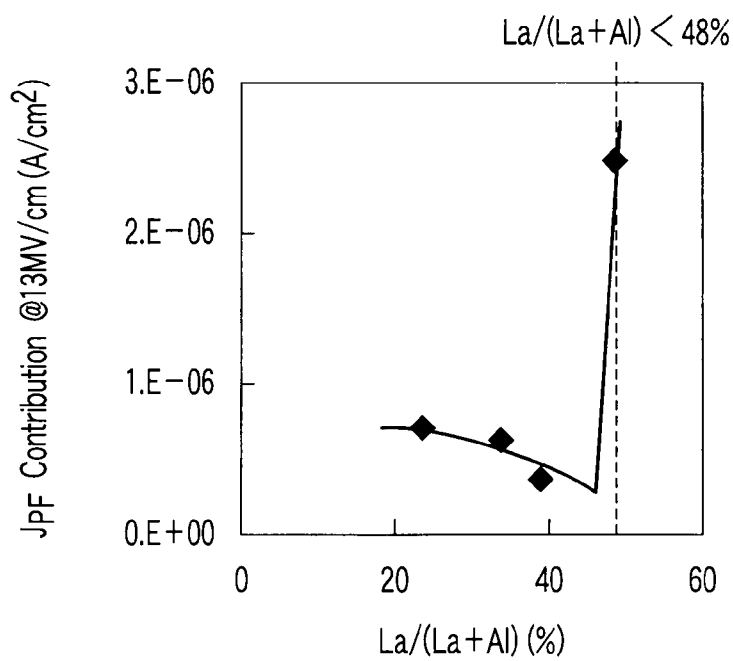
FIG. 3 is a view showing results of a second element experiment.

FIG. 3 shows results of a second element experiment relating to the leakage current.

FIG. 3 shows relation between the composition ratio La/(Al+La) at the time the same sample as that in the first element experiment is used and Poole Frenkel current component (hereinafter, referred to as PF current component).

The PF current component is a component obtained by deducting Fowler Nordheim current component (hereinafter referred to as FN current component) from an actual measured value of the leakage current in the high electric field region.

Here, the PF current component results in an index of charge trap quantity.

That quantity of the PF current component of the inter-electrode insulator or the blocking insulator is large means that charge capture/emission by the PF current component is generated largely, which is undesirable for the nonvolatile semiconductor memory.

As is clear from FIG. 3, when the composition ratio La/(Al+La) is 0.39, the PF current component is a sufficiently low value. However, when the composition ratio La/(Al+La) results in 0.48, the PF current component increases suddenly.

Therefore, when considering a charge retention property of the nonvolatile semiconductor memory, it is desirable to make the composition ratio La/(Al+La) less than 0.48.

The same results as in the first and second element experiments are obtained, when elements other than La are used as the lanthanoid-based metal Ln. The detail thereof is omitted.

In the description as above, judging from the result of the first and second element experiments, it can be said that the composition ratio Ln/(Al+Ln) between the lanthanoid-based metal and the aluminum can be preferably made the value within the range of 0.33 to 0.39 for the lanthanoid-based metal Ln, the aluminum Al, and the high dielectric constant material including oxygen O are used as the inter-electrode insulator or the blocking insulator.

In addition, the lanthanoid-based metal Ln, the aluminum Al, and the high dielectric constant material including oxygen O can be preferably formed of amorphous substances in terms of suppression of the leakage current.

The leakage current in the high electric field region decreases as compared with the conventional up to a maximum of degree of one figure; and thus it is possible to improve reliability of the nonvolatile semiconductor memory.

The memory cell of the nonvolatile semiconductor memory according to the present invention can be comprised of a MOS FET having schottky metal as source/drain regions.

3. Embodiments

There will be described embodiments of the present invention below.

(1) First Embodiment

Figure 4:
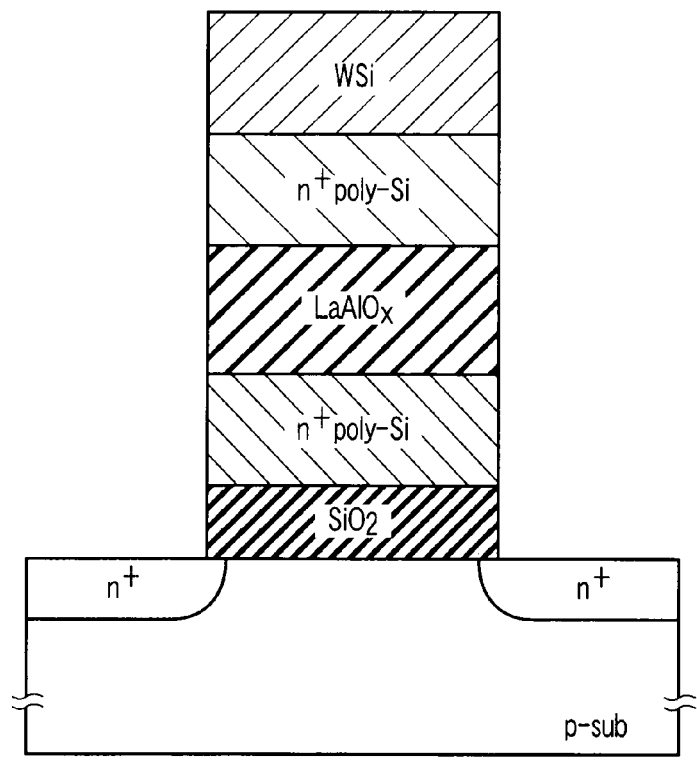
FIG. 4 is a cross-sectional view showing a memory cell of a nonvolatile semiconductor memory of a first embodiment.

FIG. 4 shows a memory cell of a nonvolatile semiconductor memory of the first embodiment.

This memory cell has a stack gate structure having a floating gate electrode and a control gate electrode.

A semiconductor substrate is a p-type silicon substrate (p-sub), and source/drain diffusion areas are n-type. A tunnel insulating film is silicon oxide ($SiO_2$) with thickness of 6 to 7 nm, a floating gate electrode is conductive polysilicon ($n^+$ poly-Si) including n-type impurity, and an inter-electrode insulator is $LaAlO_x$ with thickness of 20 to 30 nm. The control gate electrode has a stack structure of the conductive polysilicon ($n^+$ poly-Si) including n-type impurity and tungsten silicide (WSi).

The composition ratio La/(Al+La) of lanthanum and aluminum in $LaAlO_x$ is set to a value within the range of 0.33 to 0.39.

Meanwhile, the control gate electrode can employ the following materials instead of the above-described materials.

Polysilicon including p-type impurity

Conductive materials including one or more elements selected from the group of Au, Pt, Co, Be, Ni, Rh, Pd, Te, Re, Mo, Al, Hf, Ta, Mn, Zn, Zr, In, Bi, Ru, W, Ir, Er, La, Ti, and Y, silicide thereof, boride thereof, nitride thereof, or carbide thereof.

Particularly, when constituting the control gate electrode from metal having higher work function, the leakage current from the inter-electrode insulator to the control gate electrode is reduced. In this situation, since there is no depletion of the control gate electrode, EOT (equivalent oxide thickness) of the inter-electrode insulator becomes small.

In addition, the control gate electrode can be comprised of a full silicide structure such as nickel silicide (NiSi) and cobalt silicide (CoSi), or only metal.

The inter-electrode insulator can use a lanthanoid-based metal oxide aluminate other than the lanthanum aluminate, instead of the lanthanum aluminate.

In addition, the inter-electrode insulator can further include nitrogen. The composition ratio Ln/(Al+Ln) of the lanthanoid-based metal and the aluminum in the lanthanoid-based metal oxynitride aluminate is set to a value within the range of 0.33 to 0.39.

The tunnel insulating film can be comprised of an insulating film having smaller dielectric constant than the inter-electrode insulator, for instance, materials such as SiN, SiON, and $Al_2O_3$.

(2) Second Embodiment

FIG. 5 shows a memory cell of a nonvolatile semiconductor memory of the second embodiment.

This memory cell, like the first embodiment, has the stack gate structure composed of the floating gate electrode and the control gate electrode.

A semiconductor substrate is a p-type silicon substrate (p-sub), source/drain diffusion areas are n-type. A tunnel insulating film is silicon oxide ($SiO_2$) with thickness of 6 to 7 nm, and a floating gate electrode is conductive polysilicon ($n^+$ poly-Si) including n-type impurity.

The inter-electrode insulator has the stack structure of SiN with thickness of 1 to 2 nm, $SiO_2$ with thickness of 4 to 6 nm, $LaAlO_x$ with thickness of 2 to 10 nm, $SiO_2$ with thickness of 4 to 6 nm, and SiN with thickness of 1 to 2 nm.

The control gate electrode has a stack structure of a conductive polysilicon ($n^+$ poly-Si) including n-type impurity and a tungsten silicide (WSi).

The composition ratio La/(Al+La) of lanthanum and aluminum in $LaAlO_x$ is set to a value within the range of 0.33 to 0.39.

Here, $SiO_2$ and SiN present above and below $LaAlO_x$ have higher electron barrier than $LaAlO_x$. For this reason, it is possible to control the inputting/outputting of the charges to/from the floating gate electrode when the memory cell is in a charge holding state, so that it is possible to achieve stabilization of working speed or operation characteristics.

Meanwhile, the control gate electrode can employ the following materials instead of the above-described materials.

Polysilicon including p-type impurity

Conductive materials including one or more elements selected from the group of Au, Pt, Co, Be, Ni, Rh, Pd, Te, Re, Mo, Al, Hf, Ta, Mn, Zn, Zr, In, Bi, Ru, W, Ir, Er, La, Ti, and Y, silicide thereof, boride thereof, nitride thereof, or carbide thereof.

In addition, like the first embodiment, when constituting the control gate electrode from metal having higher work function, the leakage current from the inter-electrode insulator to the control gate electrode is reduced. In this situation, since there is no depletion of the control gate electrode, EOT of the inter-electrode insulator becomes small.

In addition, the control gate electrode can be comprised of a full silicide structure such as nickel silicide (NiSi) and cobalt silicide (CoSi), or only metal.

The inter-electrode insulator can use the lanthanoid-based metal oxide aluminate other than the lanthanum aluminate, instead of the lanthanum aluminate.

In addition, the inter-electrode insulator can further include nitrogen. The composition ratio Ln/(Al+Ln) of the lanthanoid-based metal and the aluminum in the lanthanoid-based metal oxynitride aluminate is set to a value within the range of 0.33 to 0.39.

The tunnel insulating film can be comprised of an insulating film having smaller dielectric constant than the inter-electrode insulator, for instance, materials such as SiN, SiON, and $Al_2O_3$.

(3) Third Embodiment

FIG. 6 shows a memory cell of a nonvolatile semiconductor memory of the third embodiment.

This memory cell has a MONOS structure whose charge trap layer is comprised of an insulating film having a charge trap function.

A semiconductor substrate is a p-type silicon substrate (p-sub), source/drain diffusion areas are n-type. A tunnel insulating film is silicon oxide ($SiO_2$) with thickness of 3 to 5 nm, and a charge trap layer is SiN with thickness of 4 to 6 nm. The blocking insulator is $LaAlO_x$ with thickness of 10 to 20 nm. The control gate electrode has a stack structure of tantalum carbide ($TaC_x$) and tungsten silicide (WSi).

The composition ratio La/(Al+La) of lanthanum and aluminum in $LaAlO_x$ is set to a value within the range of 0.33 to 0.39.

Meanwhile, the charge trap layer can be silicon oxynitride. In this situation, the composition of respective elements is not necessarily stoichiometric composition.

In addition, the charge trap layer can be oxide, nitride, or oxynitride of materials including one or more elements selected from the group of Al, Hf, La, Y, Ce, Ti, Zr, and Ta, and further can be a stack structure thereof.

In addition, the control gate electrode can employ the following materials instead of the above-described materials.

Polysilicon including n-type impurity or polysilicon including p-type impurity

Conductive materials including one or more elements selected from the group of Au, Pt, Co, Be, Ni, Rh, Pd, Te, Re, Mo, Al, Hf, Ta, Mn, Zn, Zr, In, Bi, Ru, W, Ir, Er, La, Ti, and Y, silicide thereof, boride thereof, nitride thereof, or carbide thereof.

Here, when constituting the control gate electrode from metal having higher work function, the leakage current from the inter-electrode insulator to the control gate electrode is reduced. Since there is no depletion of the control gate electrode, EOT of the inter-electrode insulator becomes small.

In addition, the control gate electrode can be comprised of a full silicide structure such as nickel silicide (NiSi) and cobalt silicide (CoSi), or only metal.

The inter-electrode insulator can use the lanthanoid-based metal oxide aluminate other than the lanthanum aluminate, instead of the lanthanum aluminate.

In addition, the inter-electrode insulator can further include nitrogen. The composition ratio Ln/(Al+Ln) of the lanthanoid-based metal and aluminum in the lanthanoid-based metal oxynitride aluminate is set to a value within the range of 0.33 to 0.39.

The tunnel insulating film can be comprised of an insulating film having smaller dielectric constant than the inter-electrode insulator, for instance, materials such as SiN, SiON, and $Al_2O_3$.

(4) Fourth Embodiment

Figure 7:
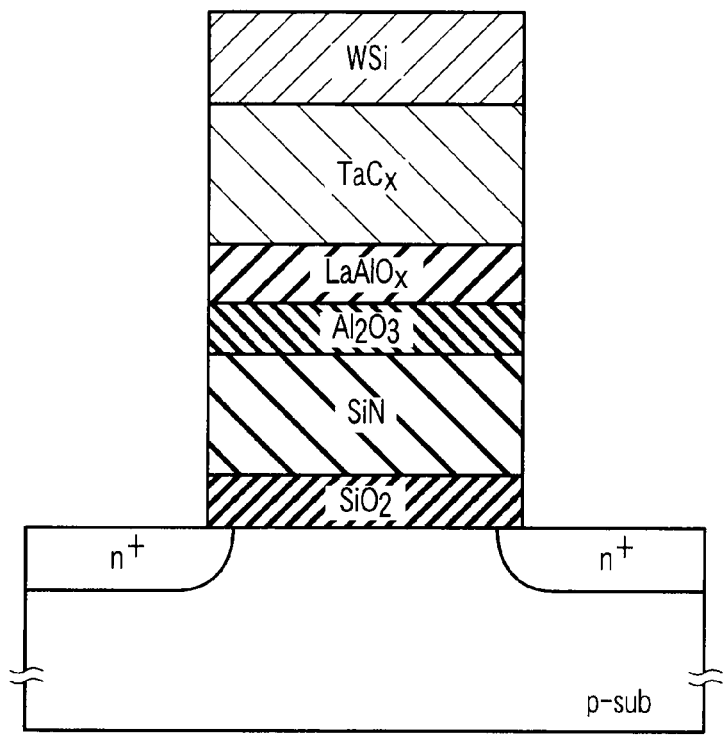
FIG. 7 is a cross-sectional view showing a memory cell of a nonvolatile semiconductor memory of a fourth embodiment.

FIG. 7 shows a memory cell of a nonvolatile semiconductor memory of the fourth embodiment.

This memory cell, like the third embodiment, has a MONOS structure whose charge trap layer is comprised of an insulating film having a charge trap function.

A semiconductor substrate is a p-type silicon substrate (p-sub), and source/drain diffusion areas are n-type. A tunnel insulating film is silicon oxide ($SiO_2$) with thickness of 3 to 5 nm, and a charge trap layer is SiN with thickness of 4 to 6 nm. The blocking insulator has a stack structure of $Al_2O_3$ with thickness of 3 to 8 nm and $LaAlO_x$ with thickness of 10 to 20 nm. The control gate electrode has a stack structure of tantalum carbide ($TaC_x$) and tungsten silicide (WSi).

The composition ratio La/(Al+La) of lanthanum and aluminum in $LaAlO_x$ is set to a value within the range of 0.33 to 0.39.

Here, $Al_2O_3$ present below $LaAlO_x$ has an electron barrier higher than that of $LaAlO_x$. For this reason, it is possible to control the inputting/outputting of the charges to/from the floating gate electrode when the memory cell is in a charge holding state, so that it is possible to achieve stabilization of working speed or operation characteristics.

Meanwhile, the charge trap layer can be silicon oxynitride. In this situation, the composition of respective elements is not necessarily stoichiometric composition.

In addition, the charge trap layer can be oxide, nitride, or oxynitride of materials including one or more elements selected from the group of Al, Hf, La, Y, Ce, Ti, Zr, and Ta, and further can be a stack structure thereof.

In addition, the control gate electrode can employ the following materials instead of the above-described materials.

Polysilicon including n-type impurity or polysilicon including p-type impurity

Conductive materials including one or more elements selected from the group of Au, Pt, Co, Be, Ni, Rh, Pd, Te, Re, Mo, Al, Hf, Ta, Mn, Zn, Zr, In, Bi, Ru, W, Ir, Er, La, Ti, and Y, silicide thereof, boride thereof, nitride thereof, or carbide thereof.

In addition, like the third embodiment, when constituting the control gate electrode from metal having large work function, the leakage current from the inter-electrode insulator to the control gate electrode is reduced. Since there is no depletion of the control gate electrode, EOT of the inter-electrode insulator becomes small.

Further, the control gate electrode can be comprised of a full silicide structure such as nickel silicide (NiSi) and cobalt silicide (CoSi), or only metal.

The inter-electrode insulator can use a lanthanoid-based metal oxide aluminate other than the lanthanum aluminate, instead of the lanthanum aluminate.

In addition, the inter-electrode insulator can further include nitrogen. The composition ratio Ln/(Al+Ln) of the lanthanoid-based metal and the aluminum in the lanthanoid-based metal oxynitride aluminate is set to a value within the range of 0.33 to 0.39.

The tunnel insulating film can be comprised of an insulating film having the dielectric constant smaller than that of the inter-electrode insulator, for instance, materials such as SiN, SiON, and $Al_2O_3$.

4. Application Example

The present invention is applicable to any nonvolatile semiconductor memory storing data by inputting/outputting charges to/from the charge trap layer. Here, there will be described about its typical example.

(1) NAND Flash Memory

Figure 8:
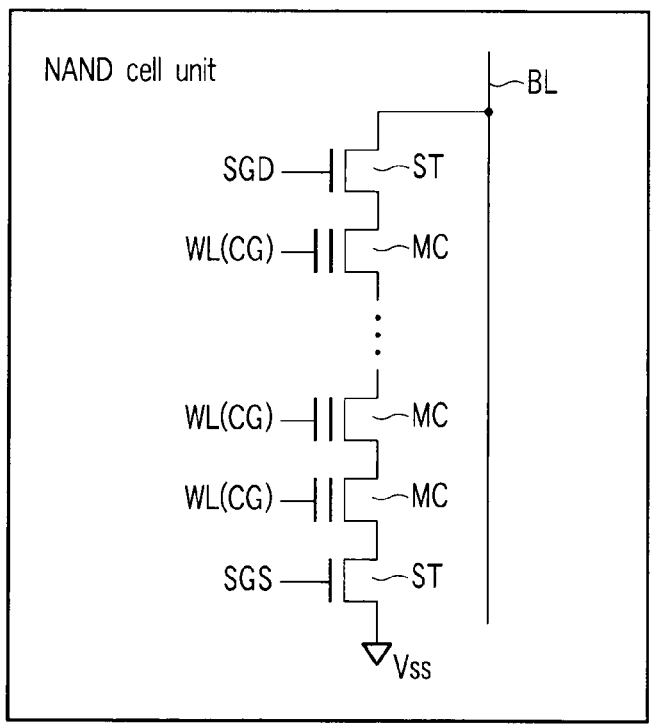
FIG. 8 is a circuit diagram showing a NAND cell unit.
Figure 9:
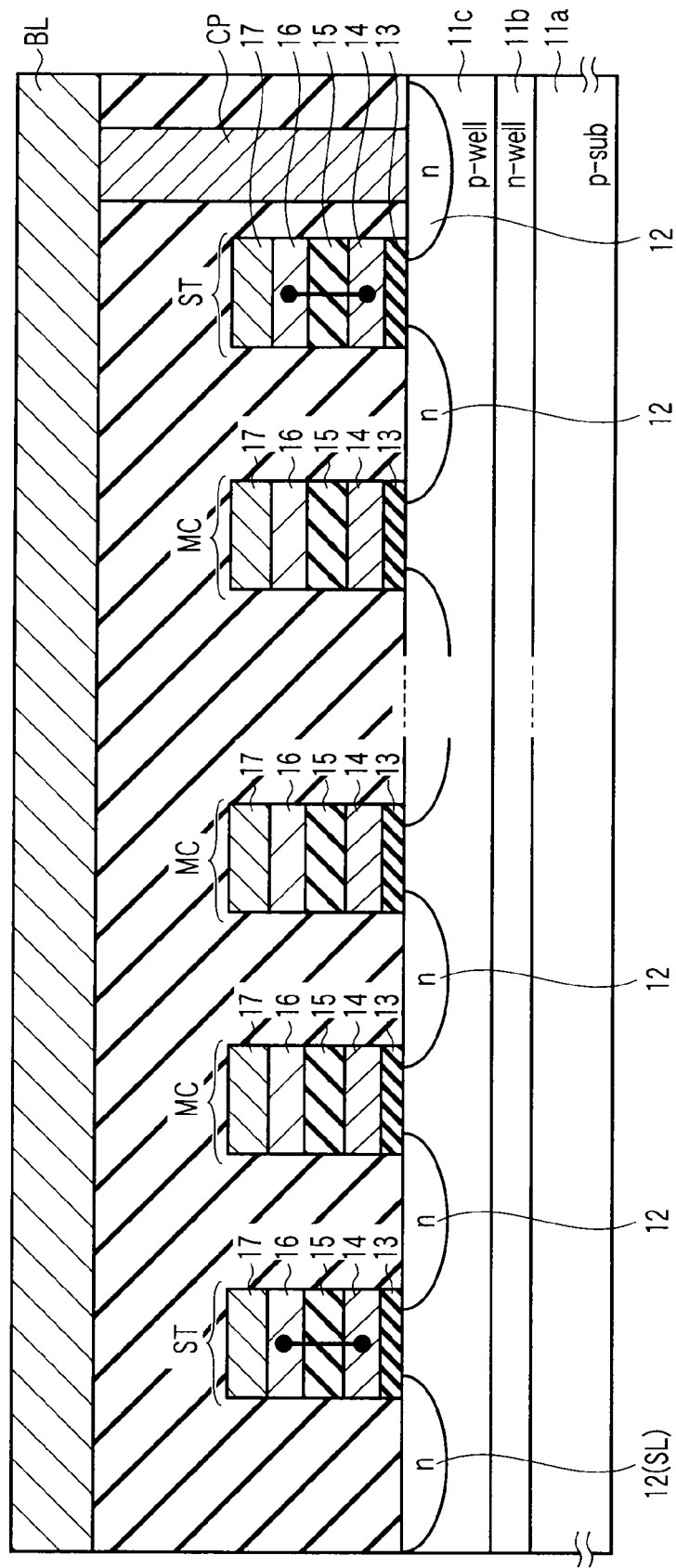
FIG. 9 is a cross-sectional view showing a device structure of the NAND cell unit.

FIG. 8 shows a circuit diagram of a NAND cell unit. FIG. 9 shows a device structure of the NAND cell unit.

In a P-type semiconductor substrate 11a, an n-type well region 11b and a p-type well region 11c are formed. In the p-type well region 11c, the NAND cell unit including the memory cell of the present invention is formed.

The NAND cell unit is comprised of a NAND string composed of a plurality of memory cells MC connected in series, and a total of two select gate transistors ST connected to its both ends one by one.

The memory cell MC and the select gate transistor ST are comprised of n-type diffusion areas 12, a gate insulating film 13 on a channel region between the n-type diffusion areas 12, a floating gate electrode 14 on the gate insulating film 13, an inter-electrode insulator 15 on the floating gate electrode 14, and control gate electrodes 16, 17 on the inter-electrode insulator 15.

The select gate transistor ST has the same structure as the memory cell MC except that the floating gate electrode 14 and the control gate electrodes 16, 17 are connected to each other electrically via a hole provided on the inter-electrode insulator 15.

One of the select gate transistors ST is connected to a source line SL, and the other one is connected to a bit line BL.

(2) NOR Flash Memory

Figure 10:
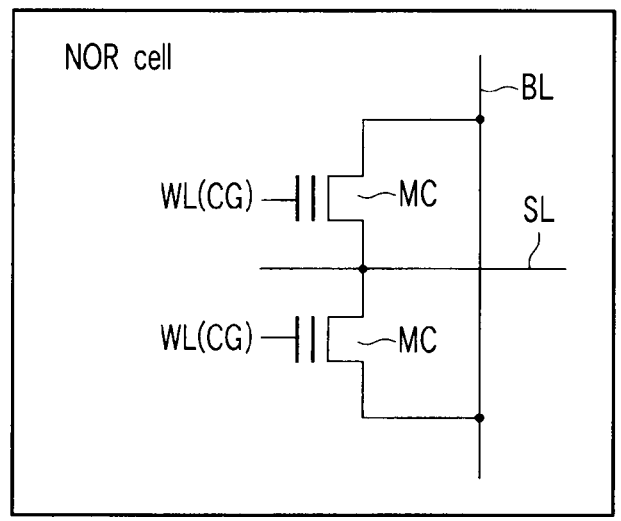
FIG. 10 is a circuit diagram showing a NOR cell unit.
Figure 11:
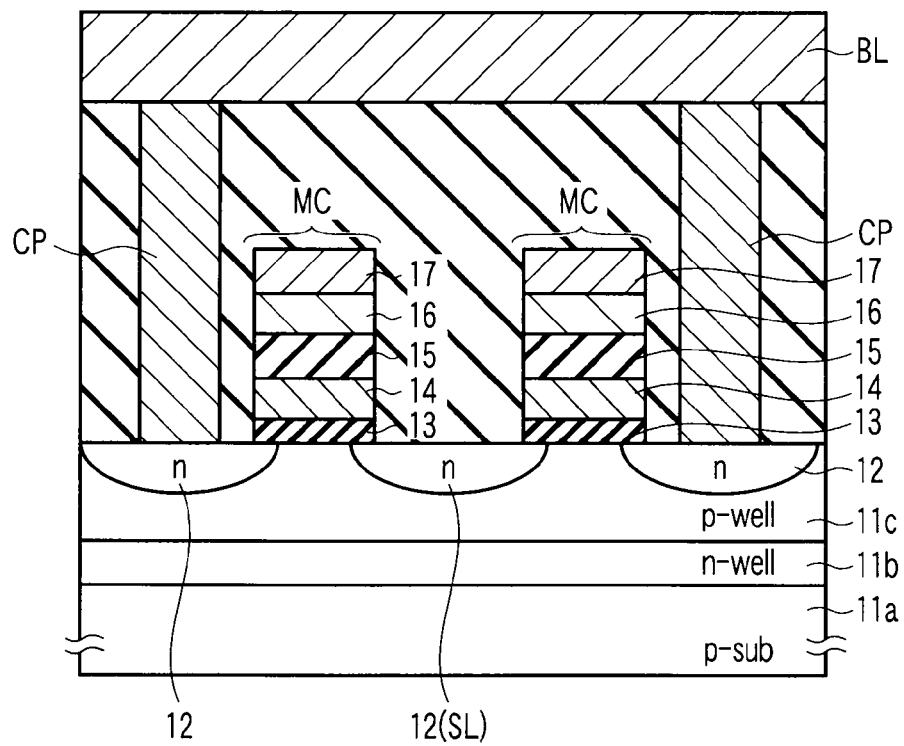
FIG. 11 is a cross-sectional view showing a device structure of the NOR cell unit.

FIG. 10 shows a circuit diagram of a NOR cell unit. FIG. 11 shows a device structure of the NOR cell unit.

In a p-type semiconductor substrate 11a, an n-type well region 11b and a p-type well region 11c are formed. In the p-type well region 11c, the NOR cell unit including the memory cell of the present invention is formed.

The NOR cell is comprised of one memory cell (MIS transistor) MC connected between the bit line BL and the source line SL.

The memory cell MC is comprised of n-type diffusion areas 12, a gate insulating film 13 on a channel region between the n-type diffusion area 12, a floating gate electrode 14 on the gate insulating film 13, an inter-electrode insulator 15 on the floating gate electrode 14, and control gate electrodes 16, 17 on the inter-electrode insulator 15.

(3) 2-tr (Two-Transistor) Cell Flash Memory

Figure 12:
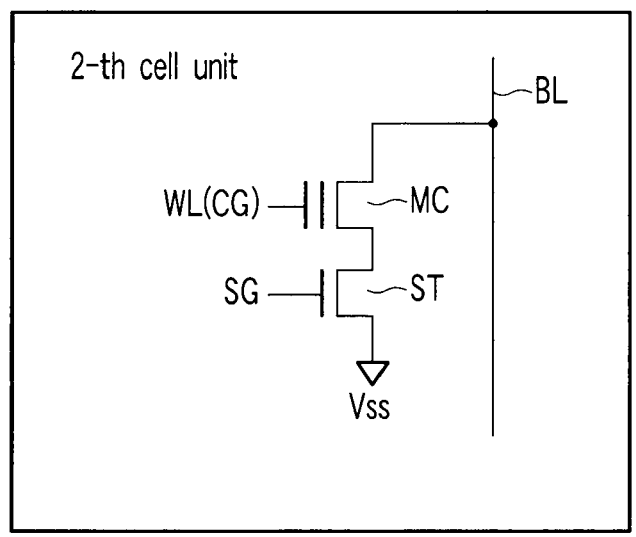
FIG. 12 is a circuit diagram showing a two-transistor cell unit.
Figure 13:
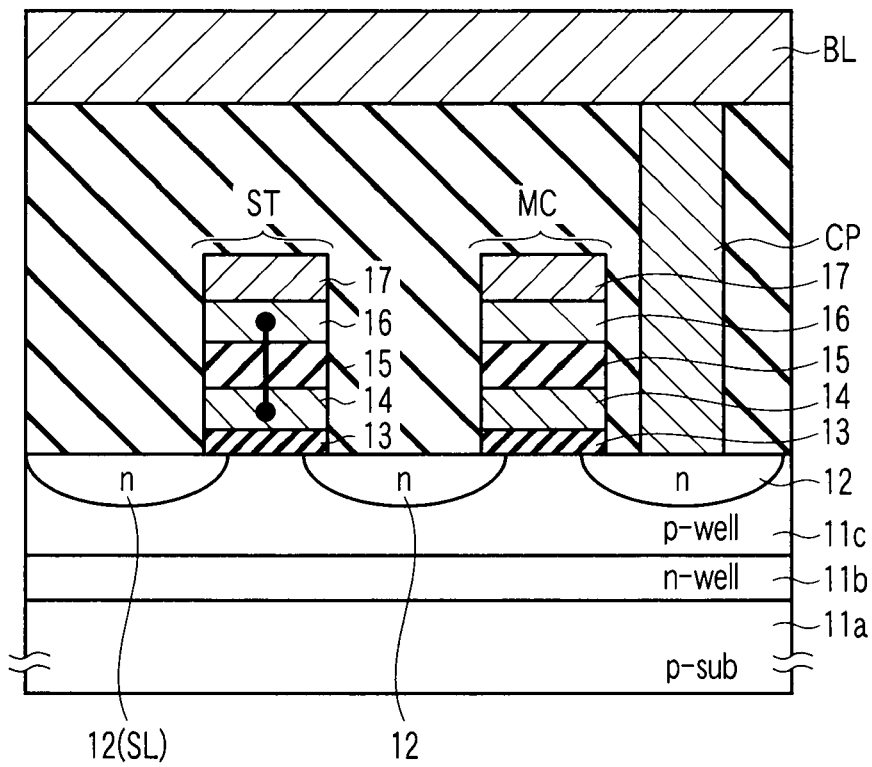
FIG. 13 is a cross-sectional view showing a device structure of the two-transistor cell unit.

FIG. 12 shows a circuit diagram of a two-transistor cell unit. FIG. 13 shows a device structure of the two-transistor cell unit.

The two-transistor cell has been recently developed as a new cell structure having both feature of the NAND cell and feature of the NOR cell.

In the p-type semiconductor substrate 11a, the n-type well region 11b and the p-type well region 11c are formed. In the p-type well region 11c, the two-transistor cell unit including the memory cell of the present invention is formed.

The two-transistor cell unit is comprised of one memory cell MC and one select gate transistor ST, connected in series.

The memory cell MC and the select gate transistor ST are comprised of n-type diffusion areas 12, a gate insulating film 13 on a channel region between the n-type diffusion areas 12, a floating gate electrode 14 on the gate insulating film 13, an inter-electrode insulator 15 on the floating gate electrode 14, and control gate electrodes 16, 17 on the inter-electrode insulator 15.

The select gate transistor ST has the same structure as the memory cell MC except that the floating gate electrode 14 and the control gate electrodes 16, 17 are connected to each other electrically via a hole provided on the inter-electrode insulator 15.

The select gate transistor ST is connected to the source line SL, and the memory cell MC is connected to the bit line BL.

5. Manufacturing Method

There will be described a manufacturing method when the nonvolatile semiconductor memory of the present invention is applied to a NAND flash memory.

Figure 14:
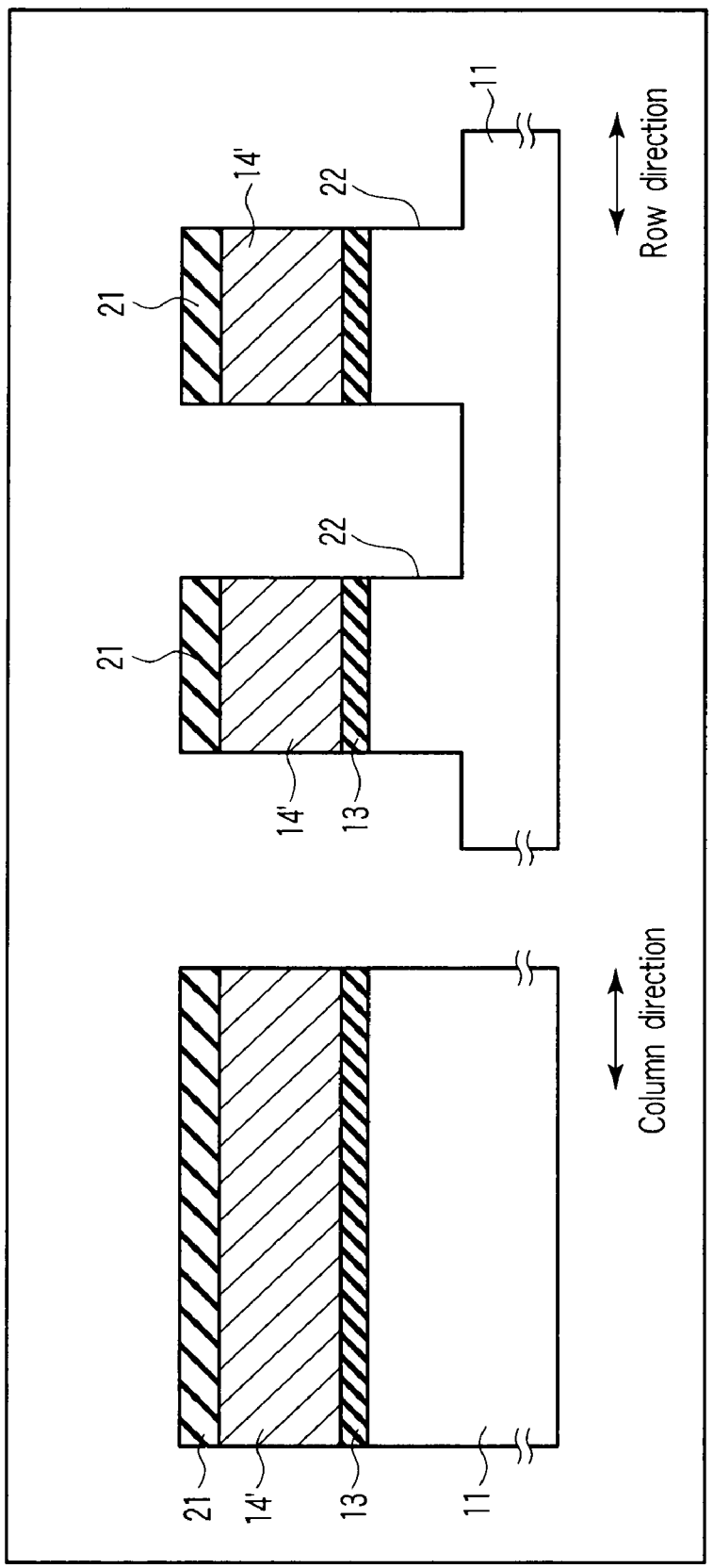
FIG. 14 is a cross-sectional view showing one process of a manufacturing method.

First, as shown in FIG. 14, on a surface of the silicon substrate 11 doped with the impurity, a tunnel oxide film 13 with thickness of approximately 7 to 8 nm is formed by thermal oxidation. In addition, by using the chemical vapor deposition (CVD) method, a phosphorus-doped polysilicon layer 14' with thickness of approximately 60 nm is formed on the tunnel oxide film 13.

Subsequently, by using the CVD method, a mask material (etching stopper) 21 is formed on the phosphorus-doped polysilicon layer 14'. In addition, a resist pattern is formed on the mask material 21.

Then, with this resist pattern as the mask, by using reactive ion etching (RIE), the mask material 21, the polysilicon layer 14', the tunnel oxide film 13, and the silicon substrate 11 are etched sequentially. As a result, an element isolation trench 22 with depth of approximately 100 nm from a top surface of the mask material 21 is formed.

Figure 15:
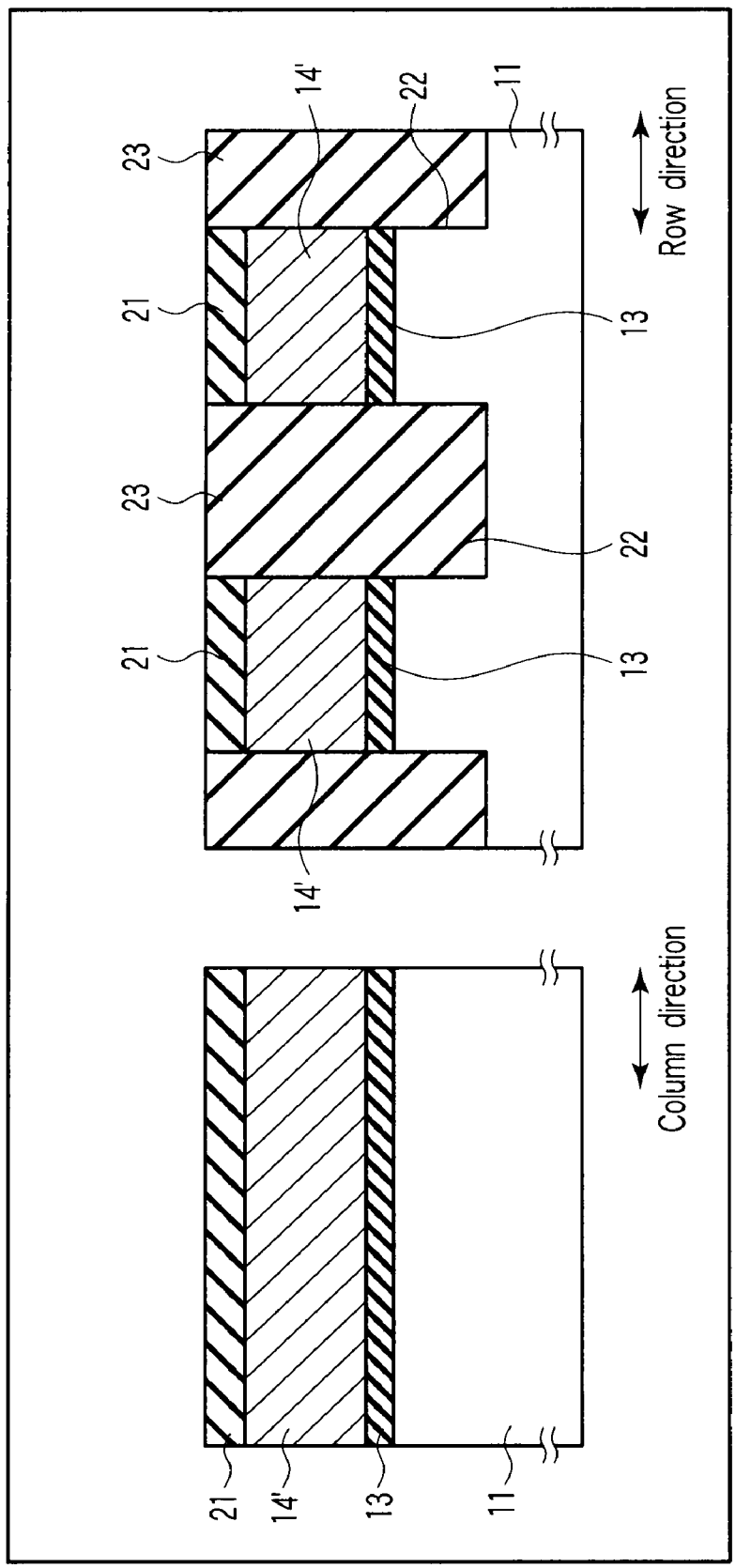
FIG. 15 is a cross-sectional view showing one process of the manufacturing method.

Next, as shown in FIG. 15, by using the CVD method, a silicon oxide film 23 is formed on the mask material 21 to completely fill the element isolation trench 22.

In addition, by using chemical mechanical polishing (CMP), the silicon oxide film 23 is polished to leave the silicon oxide film 23 only in the element isolation trench 22. In this manner, formed is an element isolation region with a shallow trench isolation (STI) structure formed of the silicon oxide film 23.

Here, the mask material 21 has functions to, at the time of the CMP, prevent the polysilicon layer 14' from being polished, and to control polishing amount of the silicon oxide film 23. That is, a top surface of the silicon oxide film 23 in the element isolation trench 22 approximately coincides with a top surface of the mask material 21.

After that, the mask material 21 is removed.

Figure 16:
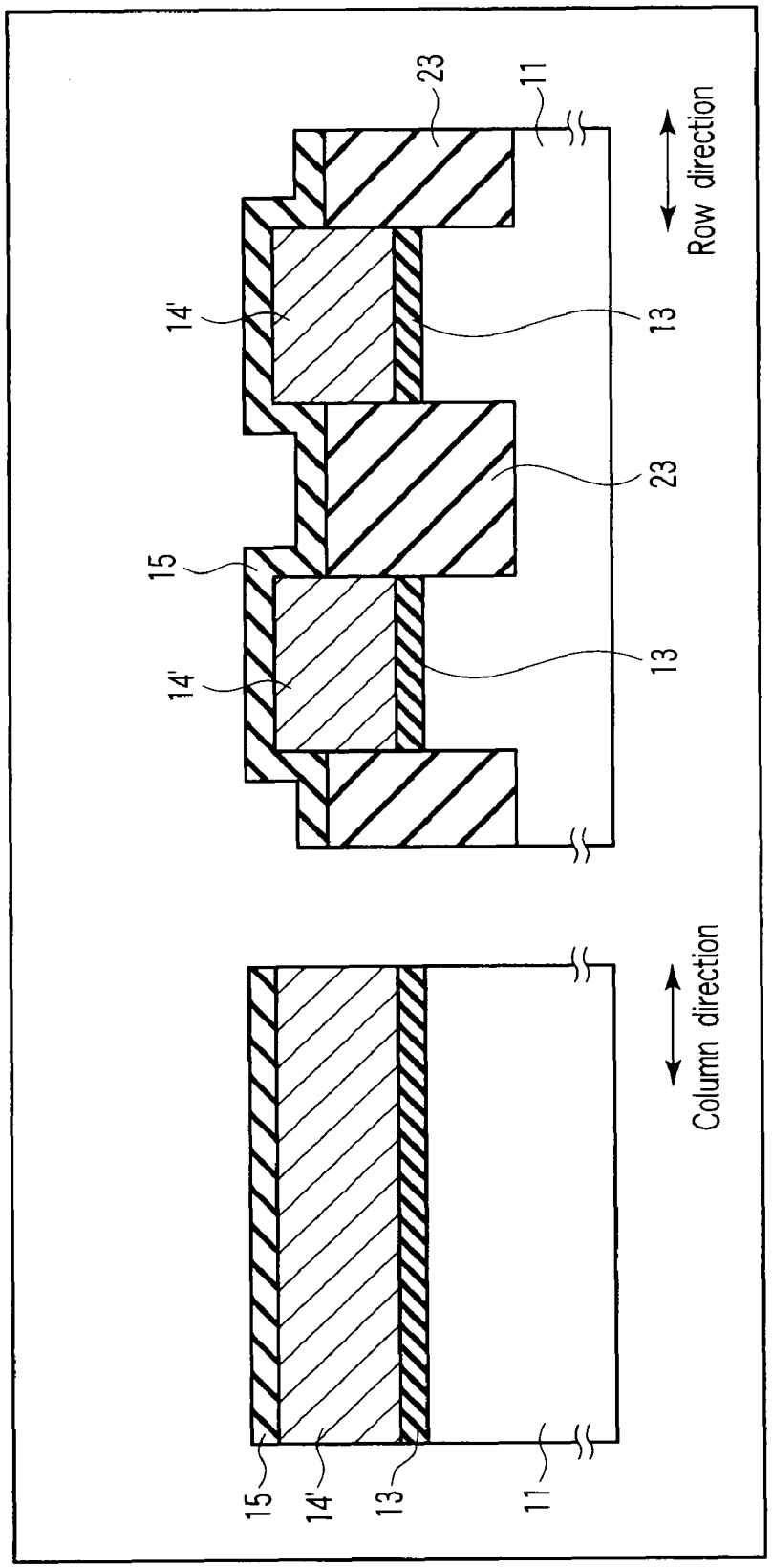
FIG. 16 is a cross-sectional view showing one process of the manufacturing method.

Next, as shown in FIG. 16, by using dilute hydrofluoric acid solution, the silicon oxide film 23 is etched back until the side surface of the polysilicon layer 14' in a row direction is exposed by a required amount.

Then, the inter-electrode insulator 15 covering a top surface and a side surface of the polysilicon layer 14' is formed on the polysilicon layer 14' and on the silicon oxide film 23.

In addition, a conductive material is formed on the inter-electrode insulator 15, and the conductive material, the inter-electrode insulator 15, the polysilicon layer 14', and the tunnel oxide film 13 are etched with the resist pattern as the mask by using RIE.

Figure 17:
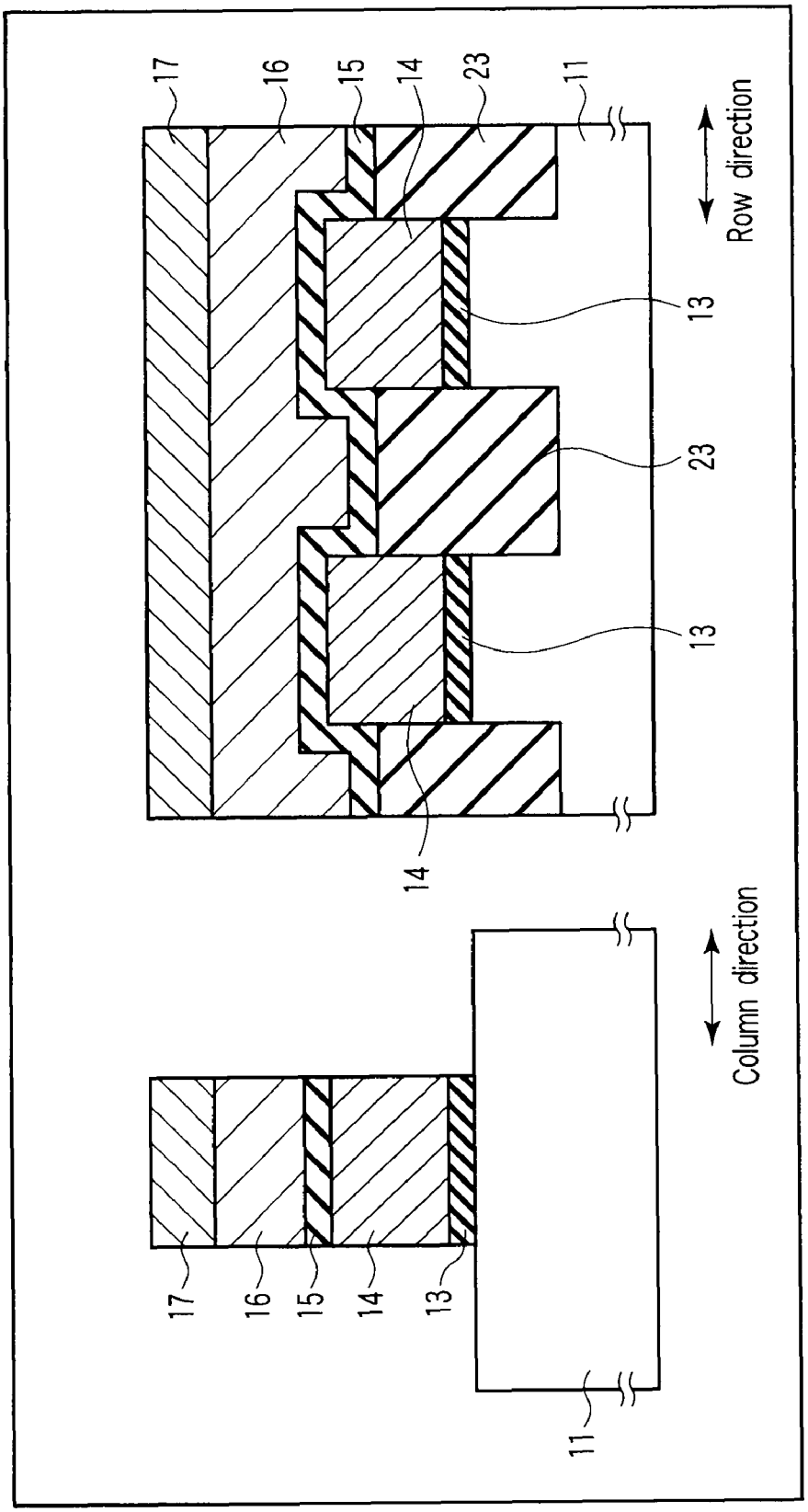
FIG. 17 is a cross-sectional view showing one process of the manufacturing method.

As a result, as shown in FIG. 17, a stack gate structure of the floating gate electrode 14 and the control gate electrodes 16, 17 is completed.

Here, the inter-electrode insulator 15 and the control gate electrodes 16, 17 are formed by, for instance, the following method, corresponding to the first and second embodiments.

Case of the First Embodiment (FIG. 4)

$LaAlO_x$ as the inter-electrode insulator is formed with La and Al as a vapor deposition source, by using the molecular beam epitaxy (MBE) method. In addition, Si/WSi as the control gate electrode is formed in such a manner that, by using the CVD method with $W(CO)_6$ as a raw material gas, after forming W on the polysilicon, part of the polysilicon and W are allowed to make heat reaction in a heat process to be converted into WSi.

Meanwhile, $LaAlO_x$ can be formed by the CVD method, the atomic layer deposition (ALD) method, the sputtering method, the vapor deposition method, the laser ablation method, or the like. In addition, W can be formed by the MBE method, the ALD method, the sputtering method, the vapor deposition method, the laser ablation method, or the like.

Case of the Second Embodiment (FIG. 5)

SiN as the inter-electrode insulator is formed by using the LPCVD method with dichlorosilane (DCS) and $NH_3$ as the raw materials. Alternatively, SiN can be formed by nitriding polysilicon with $NH_3$-nitriding or radical-nitriding, or by using the ALD method with DCS and $NH_3$ as the raw materials.

$SiO_2$ as the inter-electrode insulator is formed by using the CVD method.

$LaAlO_x$ as the inter-electrode insulator is formed with La and Al as the vapor deposition source while using the molecular beam epitaxy (MBE) method.

Si/WSi as the control gate electrode is formed in such a manner that, by using the CVD method with $W(CO)_6$ as a raw material gas, after forming W on the polysilicon, part of the polysilicon and W are allowed to make heat reaction in a heat process to be converted into WSi.

Meanwhile, $LaAlO_x$ can be formed by the CVD method, the ALD method, the sputtering method, the vapor deposition method, the laser ablation method, or the like. In addition, W can be formed by the MBE method, the ALD method, the sputtering method, the vapor deposition method, the laser ablation method, or the like.

Figure 18:
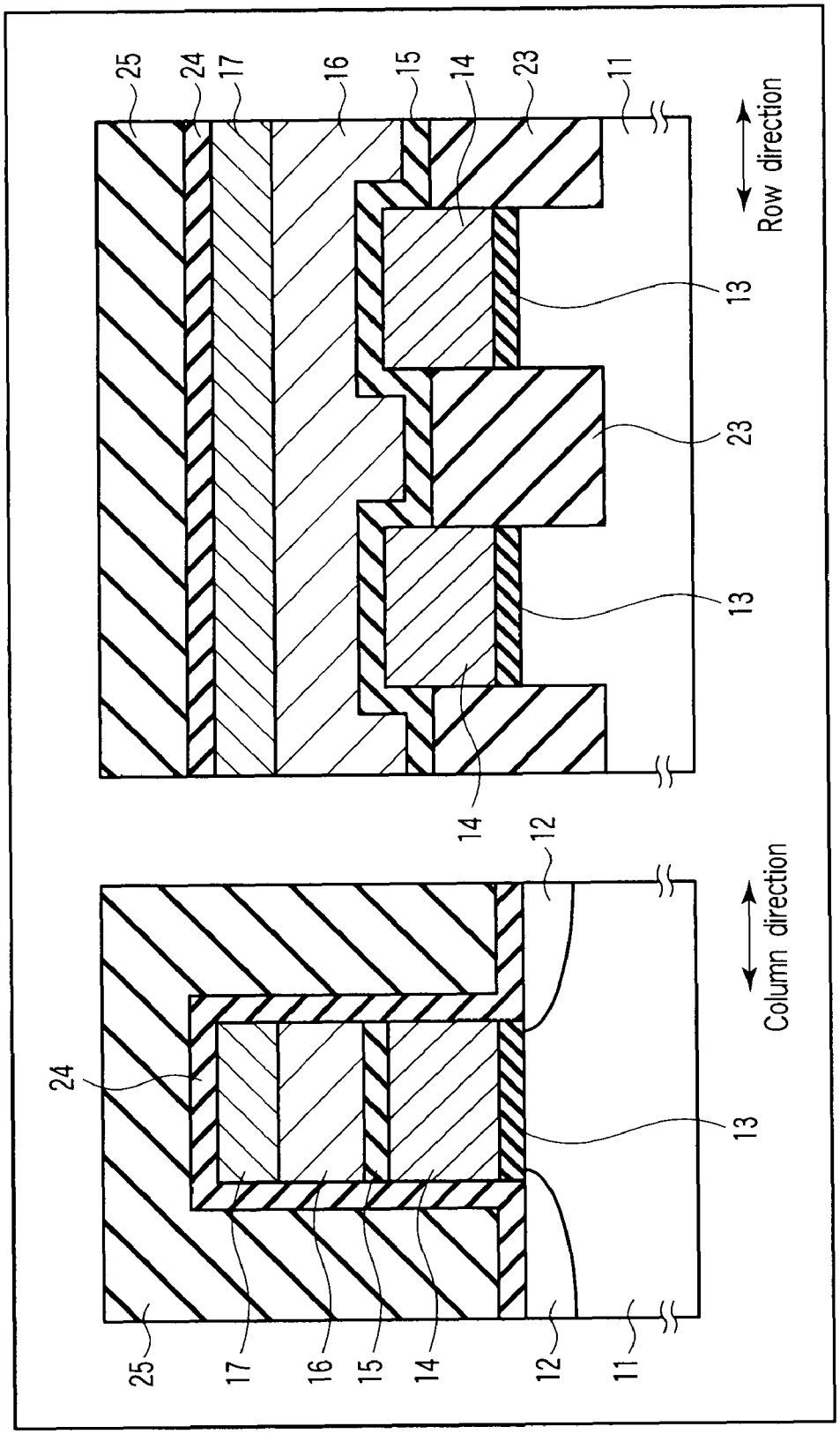
FIG. 18 is a cross-sectional view showing one process of the manufacturing method.

Next, as shown in FIG. 18, by using thermal oxidation, the silicon oxide film 24 covering the floating gate electrode 14 and the control gate electrodes 16, 17 is formed.

In addition, with the floating gate electrode 14 and the control gate electrodes 16, 17 as the mask, by using the ion implantation method, ions are implanted into the semiconductor substrate 11 in a self-aligning manner to form the source/drain diffusion areas 12, so that the memory cell of the present invention is obtained.

After that, when forming an inter-layer insulating film 25 covering the memory cell of the present invention by using the CVD method, and further forming an interconnect layer by a known method, the nonvolatile semiconductor memory is completed.

Here, the structure of the third and fourth embodiments can also be formed by the above-described manufacturing method.

However, the charge trap layer and the blocking insulator are formed by the method indicated below.

Case of the Third Embodiment (FIG. 6)

SiN as the charge trap layer is formed by using the LPCVD method with dichlorosilane (DCS) and $NH_3$ as the raw materials. In addition, SiN can be formed by nitriding polysilicon with $NH_3$-nitriding or radical-nitriding, or by using the ALD method with DCS and $NH_3$ as the raw materials.

$LaAlO_x$ as the blocking insulator is formed with La and Al as vapor deposition source while using the molecular beam epitaxy (MBE) method.

Tantalum carbide ($TaC_x$) as the control gate electrode is formed by using the sputtering method.

WSi as the control gate electrode is formed in such a manner that, by using the CVD method with $W(CO)_6$ as a raw material gas, after forming W on the polysilicon, the whole of the polysilicon and W are allowed to make heat reaction in a heat process to be converted into WSi.

Meanwhile, $LaAlO_x$ can be formed by the CVD method, the ALD method, the sputtering method, the vapor deposition method, the laser ablation method, or the like. In addition, W can be formed by the MBE method, the ALD method, the sputtering method, the vapor deposition method, the laser ablation method, or the like.

Case of the Fourth Embodiment (FIG. 7)

SiN as the charge trap layer is formed by using the LPCVD method with dichlorosilane (DCS) and $NH_3$ as the raw materials. In addition, SiN can be formed by nitriding polysilicon with $NH_3$-nitriding or radical-nitriding, or by using the ALD method with DCS and $NH_3$ as the raw materials.

$Al_2O_3$ and $LaAlO_x$ as the blocking insulator are respectively formed by using the molecular beam epitaxy (MBE) method.

Tantalum carbide ($TaC_x$) as the control gate electrode is formed by using the sputtering method.

WSi as the control gate electrode is formed in such a manner that, by using the CVD method with $W(CO)_6$ as the raw material gas, after forming W on the polysilicon, the whole of the polysilicon and W are allowed to make heat reaction in a heat process to be converted into WSi.

Meanwhile, $LaAlO_x$ can be formed by the CVD method, the ALD method, the sputtering method, the vapor deposition method, the laser ablation method, or the like. In addition, W can be formed by the MBE method, the ALD method, the sputtering method, the vapor deposition method, the laser ablation method, or the like.

6. Conclusion

According to the present invention, reliability of the nonvolatile semiconductor memory is improved by using the high dielectric constant materials, in which the leakage current is lowered at the high electric field region, as the inter-electrode insulator or the blocking insulator.

Additional advantages and modifications will readily occur to those skilled in the art. Therefore, the invention in its broader aspects is not limited to the specific details and representative embodiments shown and described herein. Accordingly, various modifications can be made without departing from the spirit or scope of the general inventive concept as defined by the appended claims and their equivalents.

What is claimed is:

1. A memory cell comprising:
   a semiconductor region;
   source/drain areas arranged separately from each other in the semiconductor region;
   a tunnel insulating film arranged on a channel region between the diffusion areas;
   a floating gate electrode arranged on the tunnel insulating film;
   an inter-electrode insulator arranged on the floating gate electrode; and
   a control gate electrode arranged on the inter-electrode insulator,
   wherein the inter-electrode insulator includes lanthanoid-based metal Ln, aluminum Al, and oxygen O, and all of the inter-electrode insulator has a composition ratio of Ln/(Al+Ln) having a value within the range of 0.33 to 0.39.

2. The memory cell according to claim 1, wherein the lanthanoid-based metal is La.

3. The memory cell according to claim 1,
wherein the inter-electrode insulator is amorphous.
4. The memory cell according to claim 1,
wherein the inter-electrode insulator is formed of lanthanum aluminate.
5. The memory cell according to claim 1,
wherein the inter-electrode insulator includes nitrogen.
6. The memory cell according to claim 1,
wherein the semiconductor region is a well region in a semiconductor substrate.
7. The memory cell according to claim 1,
wherein the floating gate electrode contains conductive polysilicon.
8. The memory cell according to claim 1,
wherein the control gate electrode comprises a stack structure of conductive polysilicon and metal silicide.
9. The memory cell according to claim 1,
wherein the control gate electrode is formed of metal silicide or metal.
10. A nonvolatile semiconductor memory comprising:
a memory cell unit including the memory cell according to claim 1; and
a bit line which is connected to the memory cell unit.
11. A memory cell comprising:
a semiconductor region;
source/drain areas arranged separately from each other in the semiconductor region;
a tunnel insulating film arranged on a channel region between the diffusion areas;
a charge trap layer arranged on the tunnel insulating film;
a blocking insulator arranged on the charge trap layer; and
a control gate electrode arranged on the blocking insulator,
wherein the blocking insulator includes lanthanoid-based metal Ln, aluminum Al, and oxygen O, and a composition ratio Ln/(Al+Ln) between the lanthanoid-based metal and the aluminum takes a value within the range of 0.33 to 0.39.
12. The memory cell according to claim 11,
wherein the lanthanoid-based metal is La.
13. The memory cell according to claim 11,
wherein the blocking insulator is amorphous.
14. The memory cell according to claim 11,
wherein the blocking insulator is formed of lanthanum aluminate.
15. The memory cell according to claim 11,
wherein the blocking insulator includes nitrogen.
16. The memory cell according to claim 11,
wherein the semiconductor region is a well region in a semiconductor substrate.
17. The memory cell according to claim 11,
wherein the charge trap layer contains nitride.
18. The memory cell according to claim 11,
wherein the control gate electrode comprises a stack structure of conductive polysilicon and metal silicide.
19. The memory cell according to claim 11,
wherein the control gate electrode is formed of metal silicide or metal.
20. A nonvolatile semiconductor memory comprising:
a memory cell unit including the memory cell according to claim 11; and
a bit line which is connected to the memory cell unit.

* * * * *